United States Patent
Johnson et al.

(10) Patent No.: US 7,860,137 B2
(45) Date of Patent: Dec. 28, 2010

(54) VERTICAL CAVITY SURFACE EMITTING LASER WITH UNDOPED TOP MIRROR

(75) Inventors: Ralph H. Johnson, Murphy, TX (US); R. Scott Penner, Vancouver (CA); James Robert Biard, Richardson, TX (US)

(73) Assignee: Finisar Corporation, Sunnyvale, CA (US)

( * ) Notice: Subject to any disclaimer, the term of this patent is extended or adjusted under 35 U.S.C. 154(b) by 140 days.

(21) Appl. No.: 11/222,433

(22) Filed: Sep. 8, 2005

(65) Prior Publication Data
US 2006/0072639 A1   Apr. 6, 2006

Related U.S. Application Data

(60) Provisional application No. 60/615,413, filed on Oct. 1, 2004.

(51) Int. Cl.
*H01S 5/00* (2006.01)

(52) U.S. Cl. .............................. 372/44.01; 372/50.124; 372/34

(58) Field of Classification Search ............... 372/44.01
See application file for complete search history.

(56) References Cited

U.S. PATENT DOCUMENTS

| | | | |
|---|---|---|---|
| 4,862,228 A | | 8/1989 | Ralph |
| 4,882,734 A | | 11/1989 | Scifres |
| 5,245,622 A | * | 9/1993 | Jewell et al. ............. 372/45.01 |
| 5,568,499 A | * | 10/1996 | Lear ........................ 372/45.01 |
| 6,044,100 A | * | 3/2000 | Hobson et al. ........... 372/46.01 |
| 6,064,683 A | * | 5/2000 | Johnson ................ 372/46.015 |
| 6,169,756 B1 | | 1/2001 | Chirovsky |
| 6,411,638 B1 | | 6/2002 | Johnson et al. |
| 6,515,308 B1 | * | 2/2003 | Kneissl et al. ................ 257/86 |
| 6,750,071 B2 | | 6/2004 | Chirovsky |
| 2001/0006528 A1 | * | 7/2001 | Sato et al. ..................... 372/46 |
| 2002/0071464 A1 | * | 6/2002 | Coldren et al. ................ 372/45 |
| 2003/0063642 A1 | * | 4/2003 | Aggerstam et al. ........... 372/45 |
| 2003/0086463 A1 | * | 5/2003 | Shin et al. ..................... 372/46 |
| 2003/0123501 A1 | | 7/2003 | Johnson |
| 2003/0123513 A1 | | 7/2003 | Villareal |
| 2003/0151042 A1 | * | 8/2003 | Hueschen .................... 257/12 |
| 2003/0157739 A1 | | 8/2003 | Jiang |
| 2003/0189963 A1 | | 10/2003 | Deppe |
| 2003/0219917 A1 | | 11/2003 | Johnson |
| 2004/0017835 A1 | | 1/2004 | Jewell |

(Continued)

OTHER PUBLICATIONS

U.S. Appl. No. 10/931,194, filed Aug. 31, 2004, Johnson, et al.

(Continued)

*Primary Examiner*—Minsun Harvey
*Assistant Examiner*—Joshua King
(74) *Attorney, Agent, or Firm*—Workman Nydegger

(57) ABSTRACT

A VCSEL with undoped top mirror. The VCSEL is formed from an epitaxial structure deposited on a substrate. A doped bottom mirror is formed on the substrate. An active layer that includes quantum wells is formed on the bottom mirror. A periodically doped conduction layer is formed on the active layer. The periodically doped conduction layer is heavily doped at locations where the optical energy is at a minimum when the VCSEL is in operation. A current aperture is used between the conduction layer and the active region. An undoped top mirror is formed on the heavily doped conduction layer.

12 Claims, 7 Drawing Sheets

U.S. PATENT DOCUMENTS

| | | | |
|---|---|---|---|
| 2004/0066820 A1 | 4/2004 | Johnson et al. | |
| 2004/0101009 A1* | 5/2004 | Johnson et al. | 372/45 |
| 2004/0120376 A1* | 6/2004 | Kwak | 372/45 |
| 2004/0206949 A1 | 10/2004 | Bour | |
| 2004/0264530 A1* | 12/2004 | Ryou et al. | 372/44 |
| 2005/0031011 A1 | 2/2005 | Biard et al. | |
| 2007/0002917 A1 | 1/2007 | Deng | |

OTHER PUBLICATIONS

U.S. Appl. No. 09/217,223, filed Dec. 12, 1998, Liu, et al.
U.S. Appl. No. 10/026,016, filed Dec. 20, 2001, Johnson.
U.S. Appl. No. 10/026,019, Dec. 20, 2001, Johnson.
U.S. Appl. No. 10/026,044, Dec. 27, 2001, Johnson.
U.S. Appl. No. 10/026,020, Dec. 27, 2001, Johnson.
Prakash, S.R., et al., Proceedings of SPIE, SPIE—The International Society for Optical Engineering, Vertical-Cavity Surface-Emitting Lasers VII, "Reliability of 1.3 micron VCSELs for Metro Area Networks", Jan. 29-30, 2003, San Jose, California, USA, vol. 4994, pp. 44-54.
Johnson, Ralph, et al., Proceedings of SPIE, SPIE—The International Society for Optical Engineering, Vertical-Cavity Surface-Emitting Lasers VII, "Long wavelength VCSELs at Honeywell" Jan. 29-30, 2003, San Jose, California, USA, vol. 4994, pp. 222-234.
Guenter, James K., et al., Proceedings of SPIE, SPIE—The International Society for Optical Engineering, Vertical-Cavity Surface-Emitting Lasers IX, "A plot twist: the continuing story of VCSELs at AOC", Jan. 25-27, 2005, San Jose, California, USA, vol. 5737, pp. 20-34.
Kisicer, D. W., et al., Proceedings of SPIE, SPIE—The International Society for Optical Engineering, Vertical-Cavity Surface-Emitting Lasers VIII, "1.3 um VCSEL production issues", Jan. 28-29, 2004, San Jose, California, USA vol. 5364, pp. 146-157.
Volz, Kerstin, et al., Journal of Crystal Growth 251 (2003) 360-366, "The role of Sb in the MBE growth of (GaIn) (NAsSb)", 2002 Elsevier Science B.V., www.sciencedirect.com.
U.S. Appl. No. 11/224,615, filed Sep. 2005, Johnson.
U.S. Appl. No. 11/670,759, filed Feb. 2007, Johnson.
U.S. Appl. No. 11/554,754, filed Oct. 2006, Johnson.
U.S. Appl. No. 11/554,473, filed Oct. 2006, Johnson.
U.S. Appl. No. 11/767,388, filed Jun. 2007, Johnson.
Ha et al., "Long-Wavelength GaInNAs(Sb) Lasers on GaAs," Sep. 9, 2002, IEEE, Journal of Quantum Electronics, vol. 38, No. 9, 1260-1267.
Yang et al., "InGaAsNSb/GaAs quantum wells for 1.55um lasers grown by molecular-beam epitaxy," Jun. 25, 2001 American Institute of Physics, Applied Physics letters, vol. 78, No. 26, 4068-4070.
U.S. Appl. No. 11/224,615, Mail Date Aug. 21, 2008, Office Action.
U.S. Appl. No. 11/554,473, Mail Date Oct. 19, 2007, Notice of Allowance.
U.S. Appl. No. 11/554,754, Mail Date Jul. 1, 2008, Office Action.
U.S. Appl. No. 11/554,754, Mail Date Dec. 20, 2008, Office Action.
U.S. Appl. No. 11/670,759, Mail Date Jul. 2, 2008, Office Action.

* cited by examiner

VERTICAL CAVITY SURFACE EMITTING LASER WITH UNDOPED TOP MIRROR

CROSS-REFERENCE TO RELATED APPLICATIONS

This application claims the benefit of U.S. Provisional Application No. 60/615,413, titled Vertical Cavity Surface Emitting Laser with Undoped Top Mirror filed Oct. 1, 2004, which is incorporated herein by reference.

BACKGROUND OF THE INVENTION

1. The Field of the Invention

The invention generally relates to lasers. More specifically, the invention relates to Vertical Cavity Surface Emitting Lasers (VCSELs).

2. Description of the Related Art

Lasers are commonly used in many modern components. One use that has recently become more common is the use of lasers in data networks. Lasers are used in many fiber optic communication systems to transmit digital data on a network. In one exemplary configuration, a laser may be modulated by digital data to produce an optical signal, including periods of light and dark output that represents a binary data stream. In actual practice, the lasers output a high optical output representing binary highs and a lower power optical output representing binary lows. To obtain quick reaction time, the laser is constantly on, but varies from a high optical output to a lower optical output.

Optical networks have various advantages over other types of networks such as copper wire based networks. For example, many existing copper wire networks operate at near maximum possible data transmission rates and at near maximum possible distances for copper wire technology. On the other hand, many existing optical networks exceed, both in data transmission rate and distance, the maximums that are possible for copper wire networks. That is, optical networks are able to reliably transmit data at higher rates over further distances than is possible with copper wire networks.

One type of laser that is used in optical data transmission is a Vertical Cavity Surface Emitting Laser (VCSEL). A VCSEL is typically constructed on a semiconductor wafer such as Gallium Arsenide (GaAs). The VCSEL includes a bottom mirror constructed on the semiconductor wafer. Typically, the bottom mirror includes a number of alternating high and low index of refraction layers. As light passes from a layer of one index of refraction to another, a portion of the light is reflected. By using a sufficient number of alternating layers, a high percentage of light can be reflected by the mirror.

An active region that includes a number of quantum wells is formed on the bottom mirror. The active region forms a PN junction sandwiched between the bottom mirror and a top mirror, which are of opposite conductivity type (i.e. a p-type mirror and an n-type mirror). Free carriers in the form of holes and electrons are injected into the quantum wells when the PN junction is forward biased by an electrical current. At a sufficiently high bias current the injected minority carriers form a population inversion (i.e. a higher concentration of free carriers in the conduction band than electrons in the valance band) in the quantum wells that produces optical gain. Optical gain occurs when photons in the active region cause electrons to move from the conduction band to the valance band which produces additional photons. When the optical gain is equal to the loss in the two mirrors, laser oscillation occurs. The free carrier electrons in the conduction band quantum well are stimulated by photons to recombine with free carrier holes in the valence band quantum well. This process results in the stimulated emission of photons, i.e. coherent light.

The active region may also include an oxide aperture formed using one or more oxide layers formed in the top and/or bottom mirrors near the active layer. The oxide aperture serves both to form an optical cavity and to direct the bias current through the central region of the cavity that is formed.

A top mirror is formed on the active region. The top mirror is similar to the bottom mirror in that it generally comprises a number of layers that alternate between a high index of refraction and a lower index of refraction. Generally, the top mirror has fewer mirror periods of alternating high index and low index of refraction layers, to enhance light emission from the top of the VCSEL.

Illustratively, the laser functions when a current is passed through the PN junction to inject free carriers into the active region. Recombination of the injected free carriers from the conduction band quantum wells to the valence band quantum wells results in photons that begin to travel in the laser cavity defined by the mirrors. The mirrors reflect the photons back and forth. When the bias current is sufficient to produce a population inversion between the quantum well states at the wavelength supported by the cavity optical gain is produced in the quantum wells. When the optical gain is equal to the cavity loss laser oscillation occurs and the laser is said to be at threshold bias and the VCSEL begins to 'lase' as the optically coherent photons are emitted from the top of the VCSEL.

The VCSEL is generally formed as a semiconductor diode. A diode is formed from a pn junction that includes a p-type material and an n-type material. In this example, p-type materials are semiconductor materials, such as Gallium Arsenide (GaAs) doped with a material such as carbon that causes free holes, or positive charge carriers to be formed in the semiconductor material. N-type materials are semiconductor materials such as GaAs doped with a material such as silicon to cause free electrons, or negative charge carriers, to be formed in the semiconductor material. Generally, the top mirror is doped with p-type dopants where the bottom mirror is doped with n-type dopants to allow for current flow to inject minority carrier electrons and holes into the active region.

Doping the top mirror results in various difficulties in lasers designed to produce longer wavelengths. For example, as wavelength of the emitted light increases, free carrier absorption also increases in the doped p-type top mirror. This added mirror loss requires higher optical gain in the quantum wells to achieve threshold bias. To achieve higher gain a higher current (i.e. threshold current) must be passed through the VCSEL to cause the VCSEL to lase. The higher mirror loss also lowers the efficiency of the VCSEL. This increases the internal heating and limits the amount of power that a VCSEL can output.

Additionally, the restriction on doping level caused by absorption in the top mirror decreases the electrical conductivity of the VCSEL which causes resistive heating in the VCSEL which limits power output, and degrades reliability.

Additionally, ramps of material composition at the boundaries between layers in the mirrors degrade thermal impedance and reflectivity. If the VCSEL is not able to conduct heat away from the active region, the operating temperature of the VCSEL may rise. If the mirror layers have a degraded reflectivity, additional layers may need to be used resulting in increased impedance and further increased heating of the VCSEL. Excessive heating can damage the VCSEL or shorten the useful life of the VCSEL or degrade its performance.

While the current designs have been acceptable for shorter wavelength VCSELs such as VCSELs emitting 850 nanometer (nm) wavelength light, longer wavelength VCSELs have been more difficult to achieve. For example a 1310 nm VCSEL would be useful in telecommunication applications. The market entry point of lasers used in 10 Gigabit Ethernet applications is 1310 nm. However, due to the thermal and optical characteristics of currently designed VCSELs as described above, 1310 nm VCSELs have not currently been feasible.

BRIEF SUMMARY OF THE INVENTION

One embodiment includes a vertical cavity surface emitting laser (VCSEL). The VCSEL includes an epitaxial structure. The epitaxial structure is deposited on a substrate. A bottom mirror is formed on the substrate and is doped so as to be conductive with the same conductivity type as the substrate. An active layer that contains quantum wells is disposed on the bottom mirror. One or more periodically doped conduction layers with conductivity type opposite that of the substrate and bottom mirror are formed on the quantum wells. The periodically doped conduction layers are most heavily doped at locations where the optical electric field will be near or at a minimum when the VCSEL is lasing. An essentially undoped top mirror is formed on the heavily doped conduction layer. Portions of the undoped top mirror are selectively removed to form an essentially circular mesa of the undoped top mirror over the center of the VCSEL active area and to expose the surface of the periodically doped conduction layer. Ohmic contact is made to the top surface of the conduction layer outside the diameter of the undoped top mirror mesa. A current aperture such as an oxide, or patterned pn junction, or patterned tunnel junction is disposed between the majority of the top mirror and the active region.

Another embodiment includes a method of fabricating a VCSEL. The method includes forming a bottom mirror on a substrate. Forming a bottom mirror includes forming alternating layers of high and low index of refraction materials. At least a portion of the materials in the bottom mirror are doped and have the same conductivity type as the substrate. The method also includes forming an active layer that contains quantum wells on the bottom mirror. The method further includes forming a heavily doped conduction layer on the active layer that has the opposite conductivity type than the bottom mirror and substrate. Forming the conduction layer includes forming the conduction layer such that doping is introduced into the conduction layer at locations where the optical electric field would be at or near a minimum when the VCSEL is lasing. The method also includes forming a top mirror on the conduction layer. Forming the top mirror includes forming an essentially undoped top mirror which may not have grades at the interfaces of the mirror. Portions of the undoped top mirror are selectively removed to form an essentially circular mesa of the undoped top mirror over the center of the VCSEL active area and to expose the surface of the periodically doped conduction layer. Ohmic contact is made to the top surface of the conduction layer outside the diameter of the undoped top mirror mesa.

Another embodiment includes a VCSEL formed on a substrate including an undoped top mirror which may not have grades at the interfaces. A periodically doped conduction layer is interposed between the undoped top mirror and the active region. A doped bottom mirror is connected to the active region. An intracavity contact is connected to the top surface of the periodically doped conduction layer. A bottom contact is connected to the substrate. A current aperture is disposed between the periodically doped conduction layer and the active region.

Advantageously some embodiments of the invention use an undoped top mirror to reduce absorption of free carriers in the top mirror. This allows for better performance of certain long wavelength VCSELs, such as the 1310 nm VCSEL. Additionally, embodiments using periodic doping reduce free carrier absorption in other parts of the VCSEL to improve VCSEL performance. The improved thermal conductivity caused by the lack of grades at the interfaces of the undoped top mirror is used advantageously to remove heat from the VCSEL by extending the top contact metal layer up the sides of the undoped top mirror mesa with partial coverage of the top surface of the top mirror mesa. When gold is used as the top contact metal the high thermal conductivity of the gold layer contacting the undoped portions of the top mirror serves to conduct heat away from the active area of the VCSEL to improve VCSEL performance.

Another embodiment includes a VCSEL with a tunnel junction at the interface between the conduction layer and the undoped top mirror. The tunnel junction comprises a thin heavily doped n-type layer of GaAs and a thin heavily doped p-type layer of GaAs. These two layers are sufficiently heavily doped that the resulting diode conducts by tunneling at zero bias. In this embodiment the desired low lateral sheet resistance is provided by the heavily doped n-type layer which has much higher carrier mobility than the heavily doped p-type layer. The intracavity contact is made to the heavily doped n-type layer using an alloyed Au:Ge contact layer under the top metal layer that forms the intracavity bond pad. The heavily doped n- and p-type layers are located at a minimum of the optical E-field to minimize free carrier absorption.

These and other advantages and features of the present invention will become more fully apparent from the following description and appended claims, or may be learned by the practice of the invention as set forth hereinafter.

BRIEF DESCRIPTION OF THE SEVERAL VIEWS OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE INVENTION

One embodiment improves performance of VCSELs at higher wavelengths by reducing or eliminating doping in the top mirror to minimize free carrier absorption. An intracavity contact can be connected to the active region via conduction layers to provide current to the active region for producing photons. Other layers of the VCSEL structure also use a method of periodic doping where dopants are more heavily concentrated at locations where the electrical field will be at a minimum so as to reduce free carrier absorption.

Figure 1:
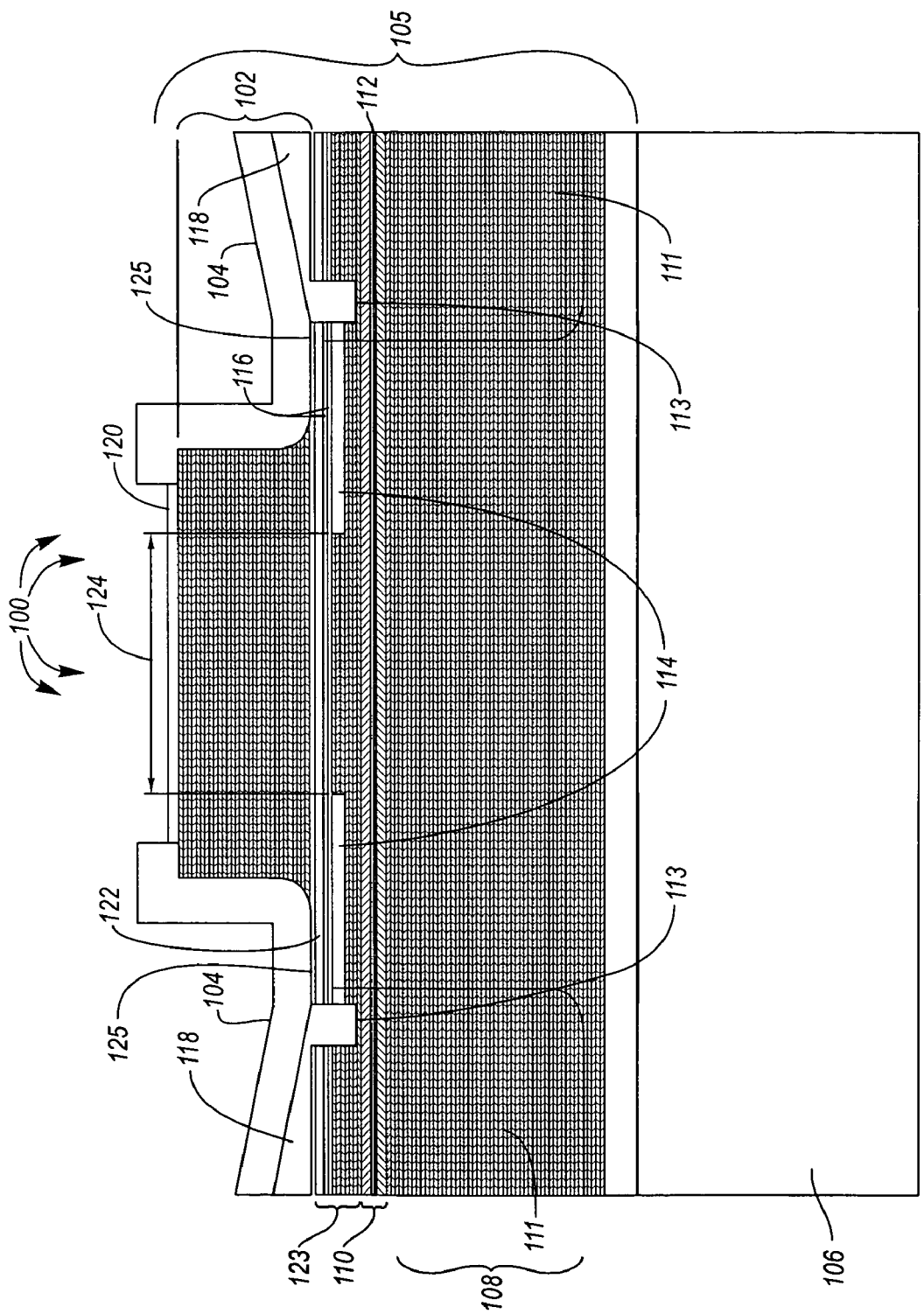
FIG. 1 illustrates a VCSEL with an undoped top mirror an intracavity contact.

With reference now FIG. 1 an illustrative embodiment includes a VCSEL 100 with an undoped top mirror 102 and intracavity contact 104. The VCSEL is formed from an epitaxial structure 105 that includes various layers of semiconductor materials that will be described in more detail below. The eptiaxial structure 105 goes through various etching, deposition and oxide growth stages in the VCSEL 100 formation.

The VCSEL 100 is formed on a substrate 106. The substrate 106, in this example, is a gallium arsenide (GaAs) substrate. In other embodiments, the substrate 106 may be other material such as other III IV semiconductor materials.

A bottom mirror 108 is formed on the substrate 106. The bottom mirror has the same conductivity type as the substrate. In the example, the bottom mirror and substrate are n-type. The bottom mirror 108 is a distributed Bragg reflector (DBR) mirror that includes a number of alternating layers of high and low index of refraction materials. In the example shown, the bottom mirror 108 includes alternating layers of aluminum arsenide (AlAs) and GaAs. The bottom mirror 108 is typically doped with a donor impurity such as silicon such that the bottom mirror is conductive.

A special ramp may be formed between the alternating layers of the bottom mirror 108. The ramp provides a gradual change of electronic affinity between the alternating layers. In the embodiment shown, the ramp includes a step from AlAs to $Al_xGa_{1-x}As$ where x is about 33 to 35% followed by an essentially linear ramp of aluminum composition from about 33% to zero (GaAs) after the step. The electron affinity is essentially constant across the step, and thus there is no need to ramp through the step. Examples of similar special ramps are disclosed in U.S. patent application Ser. No. 10/767,920, titled "Electron Affinity Engineered VCSELs" filed Jan. 29, 2004.

An active region 110 is formed on the bottom mirror 108 and is bounded laterally by proton bombarded isolation implants 111 which will be discussed in more detail below and isolation trenches 113. The active region 110 includes quantum wells 112. The central region of the quantum wells 112 under the oxide aperture 124 may also be referred to as the optical gain region. This central region of the quantum wells 112 is the location where current through the active region 110 and the presence of injected free carriers causes population inversion and optical gain. These free carriers moving from conduction band quantum well states to valence band quantum well states (i.e. across the band gap) cause the emission of photons. An oxide layer 114 is formed for lateral definition of the laser optical cavity and for directing bias current to the central region of the VCSEL active region 110.

In the embodiment shown, the conduction layer region 123 has a conductivity type opposite that of the substrate and bottom mirror and further includes a periodically doped top portion 116. In the example the conduction layer region 123 is p-type. Two or three periodically doped layers 116 are heavily doped at the optical electric field minima so as to provide a low resistance lateral current path for directing current from the Ohmic contact region 125 to the central region of the active region 110 located under the oxide aperture 124. The conduction layers 116 may be doped at between about $5 \times 10^{19}$ to $1 \times 10^{20}$ at some distance less than about $1 \times 10^{-18}$ away from the minimum of the optical electric field. In the embodiment shown, there are two periodically doped conduction layers 116 each having a sheet resistance of about 500 Ohms per square are doped with an acceptor impurity such as carbon. Using two conduction layers results in a total sheet resistance of about 250 Ohms per square.

Another embodiment of the invention uses three periodically doped conduction layers 116 in the top portion of the conduction layer region 123. Each of the periodically doped conduction layers 116 has a sheet resistance of about 500 Ohms per square. Using three conduction layers results in a total sheet resistance of about 167 Ohms. This provides a significant reduction in series resistance which lowers power dissipation and improves VCSEL performance.

A dielectric layer 118 is formed on the conduction layers 116. The dielectric 118 is taper etched to facilitate step coverage of the top contact metal 104 that extends from the Ohmic contact region 125 to the top metal bond pad (not shown in FIG. 1). Thick dielectric 118 is provided under the bond pad to decrease the capacitance between the bond pad metal and the surface of the proton bombarded region under the bond pad which comprises the conduction layer region 123, the active layer 110, and a major portion 111 of the n-type mirror 108. The intracavity contact metal 104 is connected to the top conduction layer 116 forming a top Ohmic contact. The intracavity contacts are also formed such that the intracavity contacts 104 are also connected to a bond pad (not shown) for connecting the VCSEL 100 to a current source. In the example shown, the intracavity contacts 104 extend up around the sides of the undoped top mirror 102. This provides a thermal path for dissipating thermal energy generated in the active region 110 and the conduction layer region 123.

The undoped top mirror 102 in this example is part of a mesa structure. In the example shown the undoped top mirror 102 may be for example alternating layers of higher and lower index of refraction materials. For example, the top mirror may include alternating layers of GaAs and Aluminum Gallium Arsenide (AlGaAs). One present embodiment includes AlGaAs layers that are 87.5% aluminum. Other embodiments may include AlGaAs layers that are generally in the range of 70-100% aluminum. The VCSEL 100 may be constructed using a process that uses an oxide to seal the top mirror 102 during the fabrication process of the VCSEL 100. Because the top mirror 102 is sealed from the high temperature wet oxidation process used to form the oxide layer 114, an alternate construction including alternating layers of GaAs and AlAs may be used for the top mirror 102. Layers of GaAs and AlAs may be advantageous in implementing embodiments with better thermal characteristics. Better thermal characteristics result because binary materials such as GaAs and AlAs are more thermally conductive than alloy materials such as AlGaAs. The use of binary materials in the top mirror also provides the greatest refractive index difference between the mirror layers which makes it possible to achieve the desired top mirror reflectivity with a minimum number of layer pairs. The VCSEL 100 further includes an oxide dielectric 120 to protect portions of the VCSEL 100. In one exemplary embodiment the oxide dielectric 120 has an optical thickness of $\lambda/2$ of the VCSEL wavelength to provide maximum optical reflectivity at the top exit surface of the VCSEL 100.

Various alterations may be made to the VCSEL 100 within scope of embodiments of the present invention. For example, in one embodiment, one of the conduction layers 116 may be replaced with a tunnel junction. A tunnel junction generally comprises a highly conductive diode. The highly conductive diode includes a thin heavily doped p layer of GaAs and a thin heavily doped layer of n-type GaAs. The tunnel junction layers are sufficiently heavily doped such that the resulting diode conducts by tunneling at zero bias. Low lateral sheet resistance is provided by the heavily doped n-type layer, which has much higher carrier mobility than the heavily doped p-type layer. The intracavity contact 104 is coupled to the heavily doped n-type layer using an alloyed Au:Ge contact layer under the top metal layer that forms the intracavity bond pad. The heavily doped n and p-type layers are located at or near minimums of the optical electronic field to minimize free carrier absorption. While a tunnel junction alone may not have sufficient electrical conductivity to carry the appropriate currents needed to the active region 110, using a large tunnel junction with a large surface area in combination with a conduction layer 116 may provide an adequate amount of conduction. This may allow for the use of a less than optimal tunnel junction in the VCSEL 100.

Very highly conductive tunnel junctions may be difficult to form in VCSEL structures. This difficulty results in part due to the high temperatures used when forming additional layers of the epitaxial structure 105 subsequent to formation of tunnel junctions. These high temperatures cause a diffusion of the high concentration dopants used in the heavily doped layers in the tunnel junction. This diffusion degrades the tunnel junction characteristics. However, using a less than optimal tunnel junction in conjunction with a conduction layer 116 may provide a suitable current path for directing current to the active region 110. Additionally, a highly doped optimal tunnel junction may be used if the upper mirror is deposited at a low temperature made possible by the lack of doping and conduction. The upper mirror may be, simply a dielectric stack.

In another alteration, an undoped bottom mirror, which may be grown on semi-insulating substrates, can be used as the bottom mirror 108. This further reduces free carrier absorption, and further allows for improved reflectivity and thermal conductivity by eliminating ramps between the bottom mirror 108 layers. To make contact to the n side of the p-n junction of the active region 110, a periodically doped n lower spacer (not shown) is grown between the bottom mirror 108 and the quantum wells 112. In this case a second intracavity contact is made after etching to the periodically doped lower spacer. Etching to the periodically doped lower spacer includes using an etch which stops on or in the periodically doped lower spacer.

While various layers of the epitaxial structure 105 have been described as being formed on other layers, this does not require that the layers be formed directly on the other layers. Rather, other intervening layers may exist between a layer and the layer in which that layer is formed.

Another embodiment of the invention implements a periodically doped conduction layer below the active region (as opposed to above the active region as shown in FIG. 1) and an undoped bottom mirror between the bottom conduction layer and the substrate. Cathode and anode Ohmic contacts may be provided to the VCSEL active layer by using two intracavity contacts. Using an undoped bottom mirror lowers the absorption loss in the bottom mirror and improves VCSEL performance by lowering threshold current and increasing efficiency.

Figure 2:
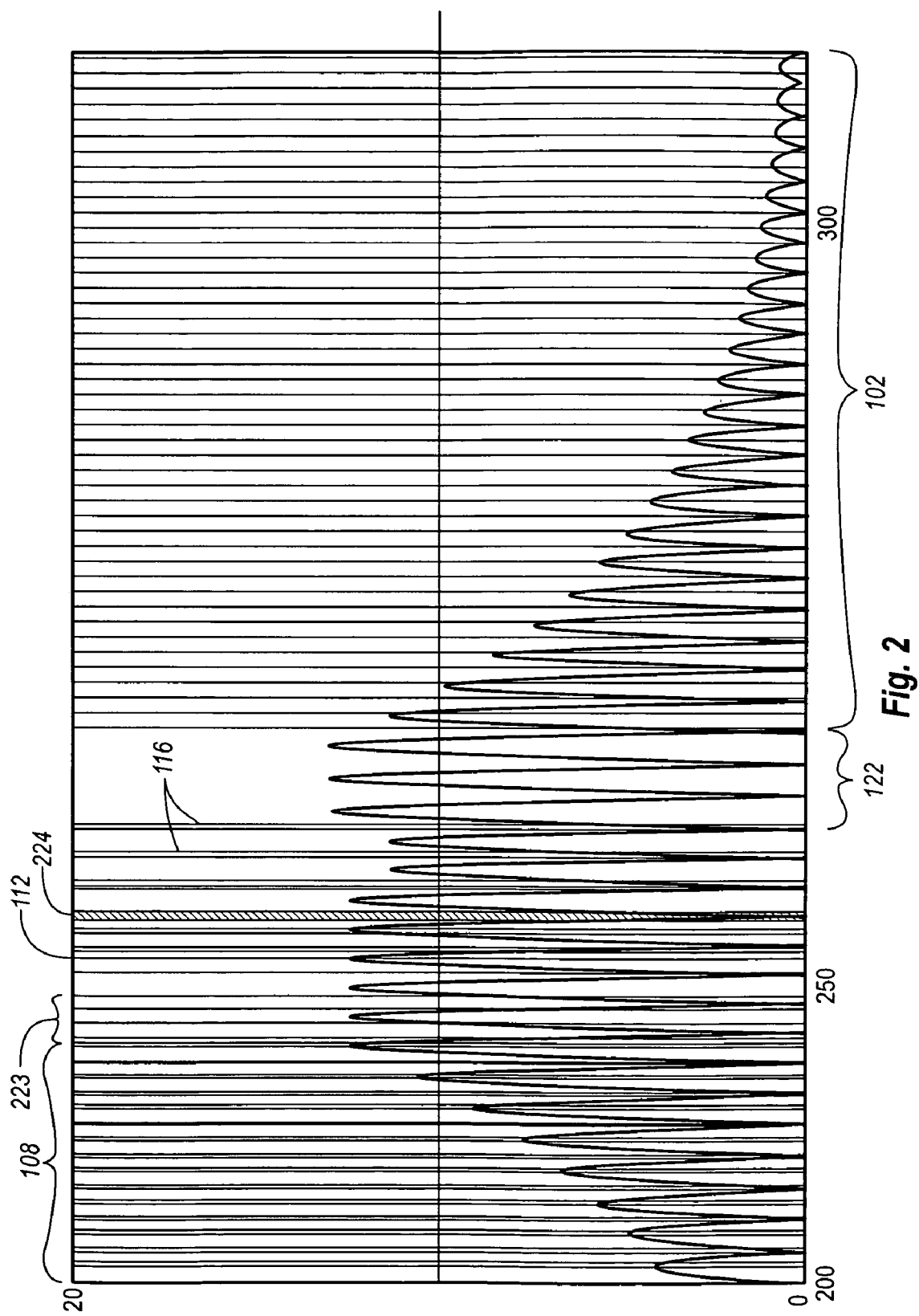
FIG. 2 illustrates a graph of electric field in a VCSEL versus the layers in an epitaxial structure.

Referring now to FIG. 2, a graph that shows the optical electric field versus the layers in the epitaxial structure 105 (FIG. 1). FIG. 2 illustrates other layers that may be included in the eptitaxial structure 105 (FIG. 1). Further, FIG. 2 is used to illustrate where dopants may be heavily concentrated or avoided to reduce free carrier absorption in the epitaxial structure 105 (FIG. 1). The electric field illustrated in FIG. 2 is shown as an absolute (positive) value, whereas in reality, the electric field may be positive or negative in various locations of the epitaxial structure 105 (FIG. 1). However, because free carrier absorption is a function of the electric field squared, which is always positive, the absolute value of the electric field is useful for designing the epitaxial structure 105 (FIG. 1).

FIG. 2 illustrates the top mirror 102. The top mirror 102 is undoped so as to reduce free carrier absorption. Free carrier absorption is a function of the level of doping. Thus by not including any dopants in the top mirror 102, free carrier absorption in the top mirror 102 is avoided.

Below the top mirror 102 is an etch stop layer 122. The etch stop layer 122 is used in fabricating the VCSL 100 (FIG. 1). This will be explained in more detail in conjunction with the description of FIGS. 3A through 3G below. The etch stop layer 122 can be used to ensure that etching done to expose the surface of the conduction layer 116 and that the etching does not remove a thin heavy doped layer on the surface of the conduction layer 116. This insures that the intracavity contacts 104 may be properly attached to the conduction layers 116 to form low resistance Ohmic contacts. The etch stop layer 122 may be undoped. The etch stop layer 122 in this example is a grown AlGaAs layer with aluminum composition between 60% and 87.5%. Periodic doping involves heavily doping a layer at locations where the electric field will be at a minimum when the VCSEL 100 (FIG. 1) is in operation. This helps to reduce free carrier absorption in a layer. The periodically doped conduction layer 116 is GaAs. A stop etch is used to expose the surface of the conduction layer 116 that etches AlGaAs but does not etch GaAs. The etch rate of the stop etch is a function of the aluminum composition which can be optimized to result in the optimum process control. Periodic doping methods are discussed in U.S. Pat. No. 6,064,683 titled Bandgap Isolated Light Emitter issued to Ralph Johnson, which is incorporated herein by reference.

Below the etch stop layer 222 are two conduction layers 116. The conduction layers 116 also use periodic doping to heavily dope portions of the conduction layers 116 where the electric field is at a minimum while controlling doping to a lower impurity concentration when the electric field is not zero. A periodically doped lower spacer 223 separates the active layer 110 from the bottom mirror 108. The AlGaAs layer 224 with, in one embodiment, 96% aluminum forms the oxide layer 114 during high temperature wet oxidation. This high aluminum AlGaAs layer 224 is formed by digital alloy growth. In the present embodiment, the digital alloy growth includes 16 layer pairs of 0.87 nm 87.5% AlGaAs and 1.76 nm of AlAs to give a total layer thickness of 43.68 nm with an average composition of 96% Al and 4% Ga in the AlGaAs. The first 8 layer pairs start with AlGaAs and end with AlAs. The last 8 layer pairs start with AlAs and end with AlGaAs. This gives a central region of AlAs with a thickness of 3.72 nm. The rate of oxidation of AlGaAs is a rapidly increasing function of Al composition. Thus, the central AlAs layer provides a sharp point on the oxidation front which is beneficial in limiting optical scattering loss at the oxide aperture and improves VCSEL performance.

Attention is now directed to various acts and processes for fabricating a VCSEL. Referring now to FIGS. 3A through 3G, various masks used in lithography steps for manufacturing the VCSEL 100 (FIG. 1) on a GaAs wafer are shown. The lithographic steps are performed on an epitaxial structure so as to form an epitaxial structure such as the epitaxial structure 105 shown in FIG. 1. Prior to applying any lithographic masks shown, a plasma oxide is deposited on the epitaxial structure. In this example, the plasma oxide deposition is approximately 2190 Angstroms of $SiO_2$. 2190 Angstroms is $\lambda/4$ wavelength in a 1310 nm laser.

Figure 3A:
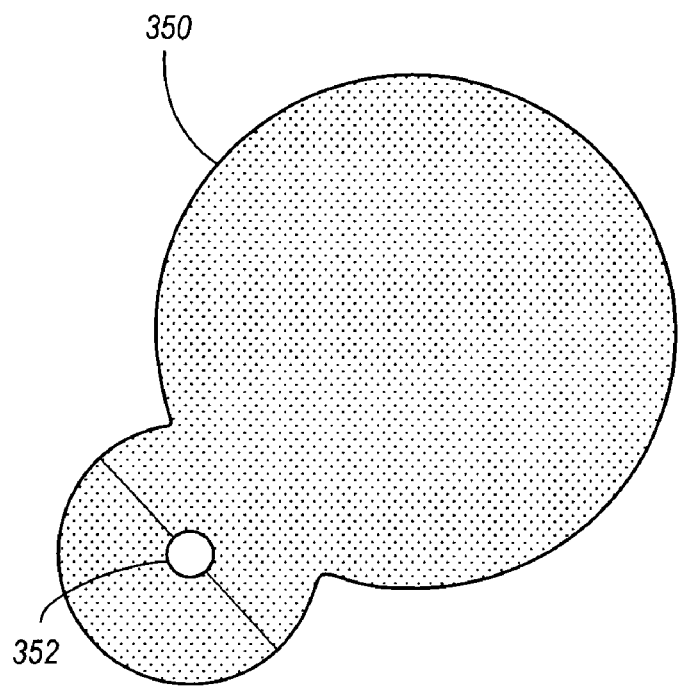
FIG. 3A illustrates a first photolithographic mask which defines an initial oxide removal pattern. This mask layer is also used to create fiducial marks used in the alignment of subsequent masks.

FIG. 3A shows the area in each VCSEL device where the initial $\lambda/4$ oxide is removed. This first mask layer 350 is also used to form fiducial marks for subsequent mask alignments. This mask also provides a feature that leaves $\lambda/4$ oxide 352 over the aperture 124 of the VCSEL 100 (FIG. 1).

Figure 3B:
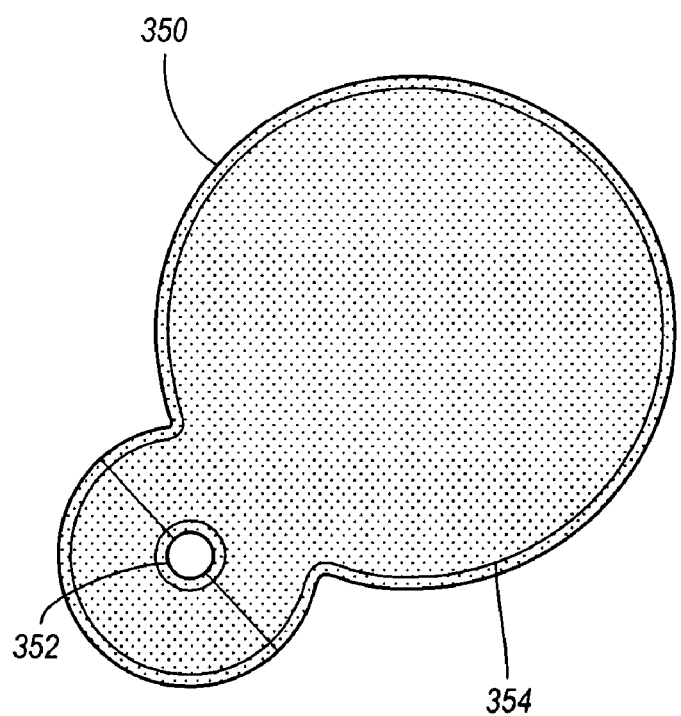
FIG. 3B illustrates photolithographic mask including a reactive ion etch mask.

FIG. 3B illustrates a deep RIE (reactive ion etch) photo resist etch mask 354 superimposed on the first mask 350. The RIE etch mask 354 is designed to overlap the $SiO_2$ remaining from the etching described in conjunction with the description of FIG. 3A above so as to protect the remaining $SiO_2$. After the RIE etch mask 354 is applied, a reactive ion etch is performed to etch to the etch stop layer 122 (FIG. 2). Etching to the etch stop layer 122 may include etching into the etch stop layer 122. A dilute HF etch is then done to etch through the etch stop layer 122 to the top conduction layer 116. In this example, the dilute HF is 400 parts deionized water to 1 part hydrofluoric acid. Other solution ratios may also be used The photoresist from the RIE etch mask 354 is then removed. Another $\lambda/4$ wavelength of $SiO_2$ is then deposited such that there are portions of the VCSEL 100 with $\lambda/4$ wavelength $SiO_2$. Other portions of the VCSEL 100 where the $SiO_2$ has been previously deposited and not etched away now have $\lambda/2$ wavelength $SiO_2$; in particular the VCSEL aperture 124 (FIG. 1) now has $\lambda/2$ wavelength $SiO_2$ above it. Because $\lambda/4$ layer of $SiO_2$ surrounds the undoped top mirror 102 (FIG. 1) at this point, the top mirror 102 (FIG. 1) can be alternating layers of AlAs and GaAs. The $SiO_2$ protects the otherwise vulnerable AlAs from the wet oxidation step that would otherwise destroy the AlAs. Binary compositions of AlAs and GaAs are used in one embodiment because they give a larger index difference and higher thermal conductivity.

Figure 3C:
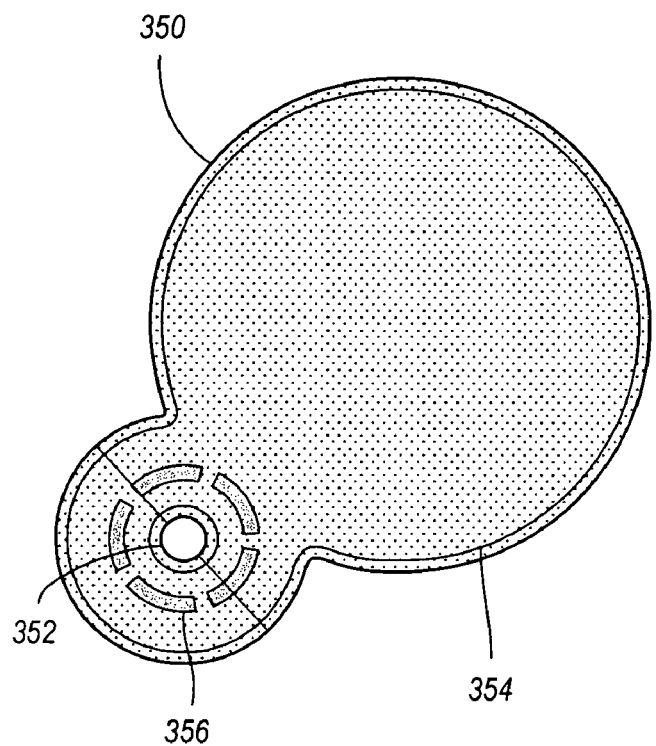
FIG. 3C illustrates photolithographic masks including a trench photomask.

Referring now to FIG. 3C, a trench photomask 356 is shown on the first mask 350 and the RIE mask 354. The trench photomask 356 defines the areas where an additional RIE etch will be done to remove material in the trenches to a depth below the 96% oxidation layer 224 (FIG. 2). A wet oxidation step will be performed to form the oxide layer 114 (FIG. 1) to a depth of about 12 $\lambda$m. The trench photomask 356 allows for the growth of a high temperature, wet aluminum oxide 114 from the edge of the trench to form the aperture 124 (FIG. 1) for the VCSEL 100. In this example, the trench photomask 356 forms a wagon wheel structure trench 113 (FIG. 1) with 5 spokes. A wagon wheel structure trench includes alternating etched and non-etched portions. The spoke configuration provides mechanical stability. Further mechanical stability may also be provided when the intracavity contact 104 (FIG. 1) is formed completely around the trench as will be described further herein.

Figure 3D:
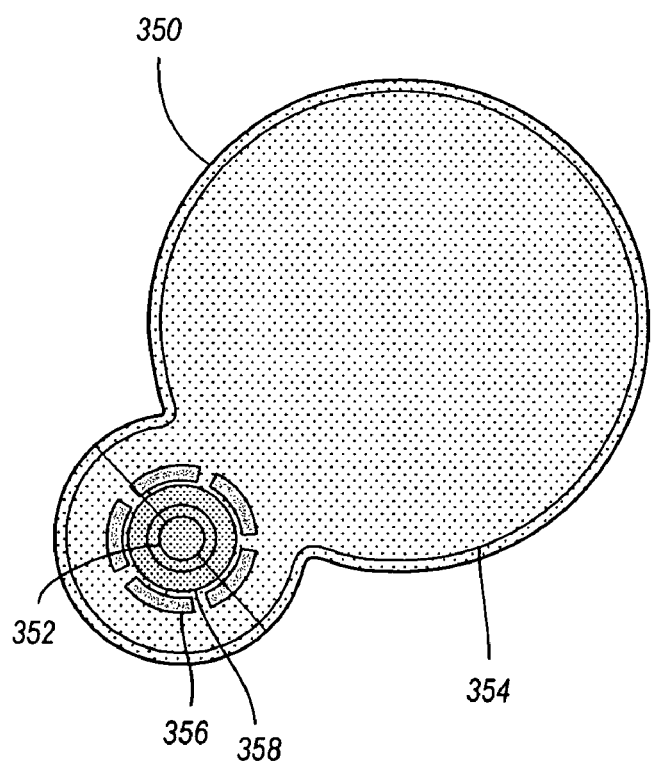
FIG. 3D illustrates photolithographic masks including a proton bombardment isolation mask.

Referring now the FIG. 3D, a stepper isolation pattern mask 358 is shown on the first mask 350, the RIE etch mask 354 and the trench photomask 356. The isolation pattern mask 358 is used to define areas of the VCSEL 100 (FIG. 1) that will be isolated from other VCSELs on a wafer by use of high energy proton bombardment. Further, the stepper isolation pattern mask 358 defines regions of the VCSEL 100 (FIG. 1) that will be rendered non-conductive so as to prevent current flow and lasing in those areas. This helps to define the active region 110 (FIG. 1) in the VCSEL 100 (FIG. 1). Protons are then implanted in the regions defined by the stepper isolation pattern mask 358. Damage produced by the protons renders the material non-conductive and accomplishes the isolation described above. This forms the isolation implant 111 (FIG. 1).

Photoresist remaining from the stepper isolation pattern mask 358 is then removed. After the photoresist has been removed, a layer of plasma nitride ($Si_3N_4$) is deposited, followed by a layer of plasma oxide ($SiO_2$). In this example, the plasma nitride is about 5,000±500 angstroms thick. The plasma oxide is about 10,000 angstroms thick. These two layers are used to reduce capacitance caused by a capacitor that is formed between the bond pad that makes up a portion of the intracavity contact 104 (FIG. 1) and the surface of the conduction layer region 123 (FIG. 1). A major portion of the bottom mirror 108 (FIG. 1) under the bond pad is also converted to an insulator by the isolation implant 111 (FIG. 1). Thus, the bond pad capacitance is formed by the plasma oxide ($SiO_2$) plasma nitride ($Si_3N_4$), and proton implanted bottom mirror layer 108 (FIG. 1).

Figure 3E:
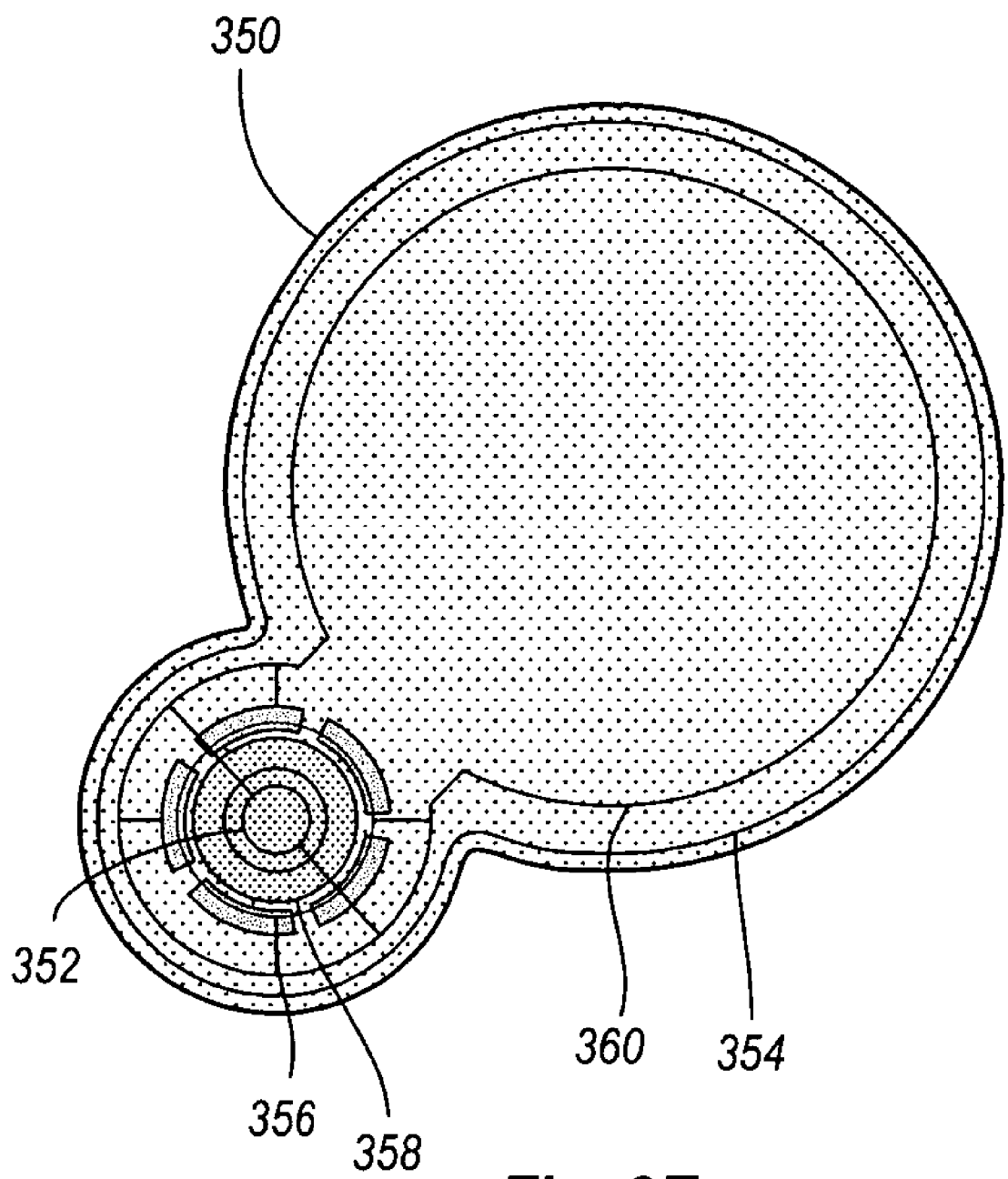
FIG. 3E illustrates photolithographic masks including a slope pattern mask for reactive ion etching (RIE)

FIG. 3E illustrates a slope etch mask 360. The slope etch mask 360 is used in tapering the edges of the dielectric material 118 (FIG. 1). Specifically, the plasma oxide is slope etched so as to leave a thick oxide under the bond pad. This may require etching into the plasma nitride. A sloped etch is used to achieve good metal step coverage in subsequent processes.

Figure 3F:
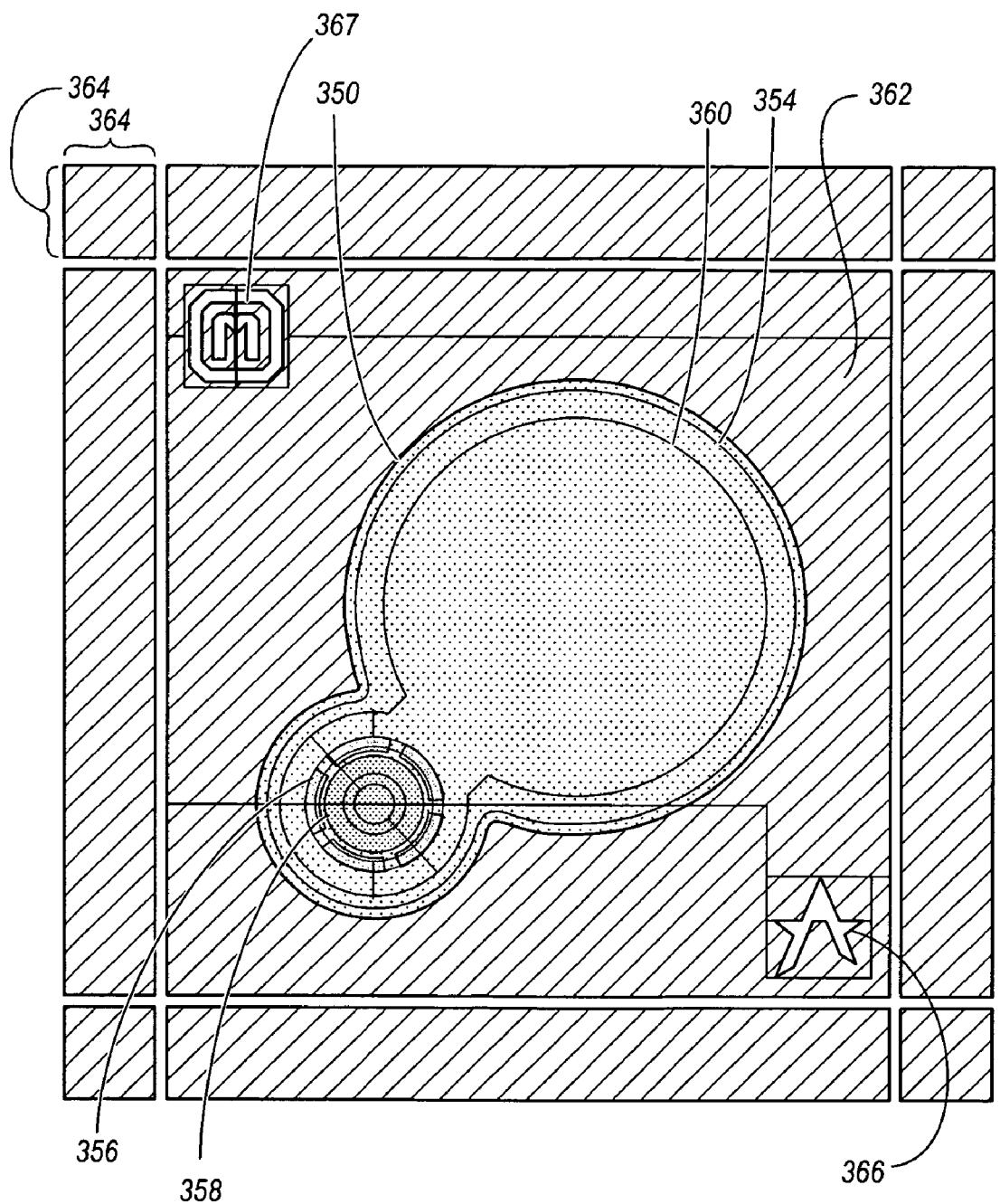
FIG. 3F illustrates photolithographic mask including a dielectric etch mask.

FIG. 3F illustrates a dielectric etch mask 362. The dielectric etch mask 362 has several functions including etching portions of the dielectric to provide a location for contacts to attach to conductive portions of the VCSEL 100 (FIG. 1), to define a saw lane 364 for marking locations of the of the VCSEL 100 (FIG. 1) where the VCSEL 100 will be separated from other VCSELs on a wafer, and to etch identifying marks such as trademarks 366 and the copyright symbol 367. As mentioned, the dielectric etch mask 326 may be used to etch portions of the plasma oxide and plasma nitride so as to expose portions of the etch stop layer or conduction layers 116. These exposed portions can then have a intracavity Ohmic contact formed on them for providing a current path to the active region 110 (FIG. 1) under the oxide aperture 124 of the VCSEL 100 (FIG. 1).

Figure 3G:
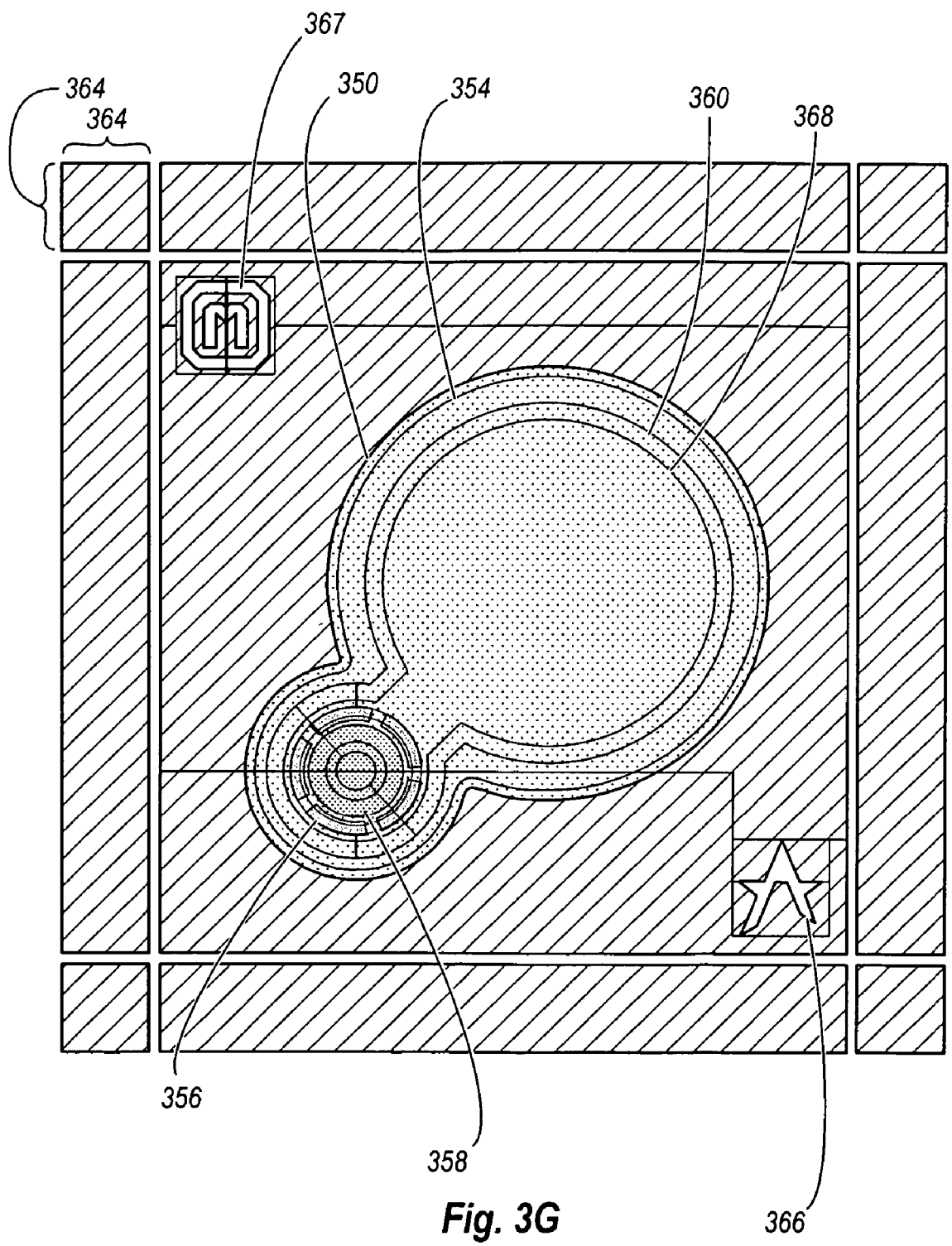
FIG. 3G illustrates a photolithographic mask including a metal contact pattern.

Referring now to FIG. 3G, a metal contact mask 368 is shown superimposed on the other masks heretofore discussed. The metal contact mask 368 defines a region where a top metal contact will be deposited on the VCSEL 100 (FIG. 1). The metal contact mask 368 results in photoresist being on areas where metal is not desired on the VCSEL 100 (FIG. 1). Metal is then deposited on the entire wafer. A liftoff process is then performed, which causes the photoresist, and any metal on the photoresist, to be removed from the VCSEL 100 (FIG. 1). The remaining metal deposited on the VCSEL 100 (FIG. 1) becomes the intracavity contact 104 (FIG. 1). As mentioned, the intracavity contact 104 (FIG. 1) provides not only an electrical contact for routing current to the active region, but, in the present example, also provides heatsinking functionality to draw heat away from the active region and to dissipate the heat at the top and sides of the undoped top mirror mesa of the VCSEL 100 (FIG. 1). In this example, the metal is TiAu. A metal layer is deposited on the backside of the wafer and alloyed to form a backside Ohmic contact on the VCSEL.

Referring still to FIG. 3G, various features of the present embodiment can be described by reference to the masks used to create those features. For example, the VCSEL 100 (FIG. 1) is formed in an array on the wafer on 250 μm centers. The portion of the saw lane attributed to each VCSEL is 25 μm wide leaving a 50 μm saw lane between VCSELs on the wafer. However, the actual saw cut used to separate the VCSEL chips is about 35 cm wide nominally in the center of the 50 μm saw lane. After sawing the size of each VCSEL 100 is about 215 μm×215 μm. The center of the active region 110 is about 55 μm from the edge of the saw lanes 364 or 62.5 μm from the edge of the saw cut. The bond pad, defined by the metal contact mask 368, has a diameter of about 90 μm. The RIE cavity around the bond pad and defined by the RIE etch mask is about 125 μm. This gives lateral clearance for a ball bond used for wire bonding contacts on the VCSEL 100 (FIG. 1). The RIE cavity around the active region has a diameter of about 60 μm.

Additionally, a top side n-type contact can also be used, by etching the oxidation trench etch all the way to n conduction layers on the top of the lower mirror and depositing and alloying metal to these layers and bringing it out to a larger bond pad which may be on the bottom of an expanded trench region.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A VCSEL comprising a substrate of a first conductivity type and an epitaxial structure, wherein the epitaxial structure comprises:
    a bottom DBR mirror disposed on the substrate wherein the bottom mirror is doped to the first conductivity type and wherein the bottom DBR mirror comprises alternating layers of AlAs and GaAs with ramps between the AlAs and GaAs layers, the ramps including a step change to AlGaAs with at least 30% aluminum and an essentially continuous ramp of decreasing aluminum composition between the step change and the GaAs layer;
    an active layer disposed on the bottom mirror that contains quantum wells;
    a periodically doped first conduction layer of a second conductivity type, the first conduction layer at least partially contacting the active layer, the doped first conduction layer being heavily doped at a location where the optical electric field is at about a minimum;
    an aperture formed in the epitaxial structure above the quantum wells; and
    a thermally conductive top mirror coupled to the periodically doped first conduction layer, the top mirror forming a mesa structure having a lateral wall, wherein the top mirror is essentially undoped, the top mirror having alternating layers that are substantially non-graded at an interface between the alternating layers so as to increase heat conduction through the top mirror;
    a thermally conductive intra-cavity contact layer having a first portion that is deposited on the first conduction layer an a second portion formed above the first portion wherein the second portion completely covers the lateral wall of the mesa structure and at least partially covers the top of the mesa structure so as to conduct heat from the mesa structure, wherein the second portion does not block the aperture; and
    the active region, top mirror, and bottom mirror configured to emit a laser beam from the top mirror.

2. The VCSEL of claim 1, wherein the top minor comprises alternating layers of GaAs and AlGaAs.

3. The VCSEL of claim 2, wherein the AlGaAs has an aluminum content in a range from 70%-100%.

4. The VCSEL of claim 1, wherein the top minor comprises alternating layers of GaAs and AlAs when the VCSEL is constructed using an oxide to seal the top mirror during a fabrication process of the VCSEL.

5. The VCSEL of claim 1, wherein the first conduction layer comprises a sheet resistivity of about 500 Ohms/square.

6. The VCSEL of claim 1, wherein the active region comprises a tunnel junction coupled to the first conductive layer and the quantum wells.

7. The VCSEL of claim 1, wherein the epitaxial structure contains a second conduction layer coupled to the first conduction layer and the active layer.

8. The VCSEL of claim 1, wherein the epitaxial structure contains a second and third conduction layer coupled to the first conduction layer and the active layer.

9. The VCSEL of claim 1, wherein the intracavity contact layer comprises TiAu.

10. The VCSEL of claim 1, wherein the intracavity contact layer extends from the first conduction layer to the top of the mesa structure.

11. The VCSEL of claim 1, further comprising a wagon wheel structure formed from trenches etched into the conduction layer.

12. The VCSEL of claim 1, wherein the bottom spacer is periodically doped such that a portion where the optical power or electric field is at about a minimum when the VCSEL is in use is more heavily doped than other portions of the bottom spacer.

* * * * *